United States Patent [19]
Yamaguchi

[11] Patent Number: 6,157,234
[45] Date of Patent: Dec. 5, 2000

[54] PULSE SIGNAL OUTPUT CIRCUIT

[75] Inventor: Hiroshi Yamaguchi, Tokyo, Japan

[73] Assignee: NEC Corporation, Tokyo, Japan

[21] Appl. No.: 09/233,103

[22] Filed: Jan. 19, 1999

[30] Foreign Application Priority Data

Jan. 17, 1998 [JP] Japan .................................. 10-020234

[51] Int. Cl.[7] .................................................. H03H 11/26
[52] U.S. Cl. ............................................ 327/175; 327/263
[58] Field of Search .................................... 327/172–175,
327/176, 141, 161, 165, 166, 170, 231,
233, 234, 236, 237, 261, 276, 277, 263

[56] References Cited

U.S. PATENT DOCUMENTS

| | | | |
|---|---|---|---|
| 4,799,022 | 1/1989 | Skierszkan | 327/116 |
| 5,059,818 | 10/1991 | Witt et al. | 327/175 |
| 5,105,108 | 4/1992 | Ngo | 327/158 |
| 5,182,480 | 1/1993 | Goto | 327/266 |
| 5,670,903 | 9/1997 | Mizuno | 327/158 |
| 5,917,353 | 6/1999 | Teel | 327/176 |

FOREIGN PATENT DOCUMENTS

| | | |
|---|---|---|
| 0 604 126 | 6/1994 | European Pat. Off. . |
| 0 762 262 | 3/1997 | European Pat. Off. . |
| 60-217722 | 10/1985 | Japan . |
| 63-237610 | 10/1988 | Japan . |
| WO 95/22206 | 8/1995 | WIPO . |

*Primary Examiner*—Timothy P. Callahan
*Assistant Examiner*—Minh Nguyen
*Attorney, Agent, or Firm*—Sughrue, Mion, Zinn Macpeak & Seas, PLLC

[57] ABSTRACT

An integrated circuit has a first circuit which receives an input signal and outputs a first output signal, wherein the first output signal is produced by changing the pulse width of the input signal, a second circuit which receives the first output signal and outputs a second output signal, wherein the second output signal is produced by delaying the first output signal and a control circuit. The control circuit has a first control circuit which receives the first and second output signals and controls the first circuit based on the first and second output signals and a second control circuit which receives the first and second output signals and controls the second based on the first and second output signals.

14 Claims, 9 Drawing Sheets

PULSE SIGNAL OUTPUT CIRCUIT

BACKGROUND OF THE INVENTION

The present invention relates to an integrated circuit and more particularly to an integrated circuit for producing pulse signals with a desired duty.

A conventional circuit of this type includes a pulse signal generating circuit. Japanese Patent Publication Laid-Open No. 60-217722 discloses a conventional integrated circuit which has the signal generating circuit (hereinafter refered to as a first conventional integrated circuit).

Referring to FIG. 12, the first conventional integrated circuit has a delay path L0 with a delay time of t1+t2. Delay path L0 consists of a series connection of a delay path L1, with a delay time of t1, and a delay path L2, with a delay time of t2. The output of delay path L0 is logically inverted by an inverter 1202 and fed back into the input of delay path L0 through an OR circuit 1201. The output from the middle tap point of delay path L0, the output of delay path L1, is also logically inverted by an inverter 1203 and fed back into the input of delay path L0 through an OR circuit 1201. Thus, a delay loop with a delay time of t1 and a delay loop with a delay time of t1+t2 are formed.

Next, the operation of the first conventional integrated circuit will be described.

As described above, logic signals (pulse signals) circulating through the two delay loops are integrated into one logic signal by OR circuit 1201, which is then returned to the input of delay path L0. In other words, signals, which circulate two types of delay loops having different delay times, interfere with each other, and the generated pulse signal is outputted. As a result, by maneuvering the two delay times t1 and t2, the duty of the output pulse signal, the ratio of tm=t1 and tm=t1+t2, is controlled to produce a desired duty.

Another conventional integrated circuit is disclosed in Japanese Patent Application Laid-Open No. 63-237610 (hereinafter refered to as a second conventional integrated circuit).

Referring to FIG. 14, the second conventional integrated circuit comprises: an exclusive OR circuit 1401 which produces a multiplied signal by performing an exclusive OR operation on the input signal and the input signal delayed by a plurality of delay circuits 1402, each of which has a different delay time; a duty determination circuit 1403 for outputting the determination signal specifying the direction of change in delay amounts of the delay circuit 1402 for making the output of the exclusive OR circuit 1401 a fixed duty value; and a selector 1404 for inputting the determination signal from the duty determination circuit 1403 and switching the delay time of the delay circuit 1402 based on the specified direction of change in delay time.

In FIG. 15, duty determination circuit 1403 includes an integration circuit 14031 that is used for detecting the high and low level pulse widths of the output signal.

Next, the operation of the second conventional integrated circuit will be described.

Duty determination circuit 1403 detects the high and low level pulse widths of the multiplied signal outputted from the exclusive OR circuit as a voltage, and switches selector 1404 so that the high and low level pulse widths become the predetermined value. Thus, the duty of the output signal produced by multiplying the input signal can be set to a desired value.

In the first conventional integrated circuit, however, a problem occurs because the lower limit of the operating frequency is restricted. If the delay time of the delay path is increased, the waveform of the pulse signal deteriorates because the circuit is configured as a ring oscillator. The waveform deterioration produces noise which causes a malfunction.

The first conventional integrated circuit also produces another problem because after the circuit operation stabilizes and stops for a time longer than the cycle of the input signal, the input signal can not be followed immediately when the input of the input signal is started again. This is because the circuit is configured as a ring oscillator.

On the other hand, in the second conventional integrated circuit, a problem occurs because after the circuit operation stabilizes and stops for a time longer than the cycle of the input signal, the input signal can not be followed immediately when the input of the input signal is started again. This is because integration circuit 14031 is used in the duty determination means.

The second conventional integrated circuit causes other problems because the output signal is restricted to the signal obtained by multiplying the input signal and the duty of the output signal does not become 50 percent unless the duty of the input signal is 50 percent.

SUMMARY OF THE INVENTION

Accordingly, an object of the present invention is to provide a integrated circuit which equalizes the high level pulse width of the output signal with the low level pulse width of the output signal even if the high and low level pulse widths in the input signal are different.

According to one aspect of the present invention, an integrated circuit is provided which comprises: a first circuit which receives an input signal and outputs a first output signal, wherein the first output signal is produced by changing the pulse width of the input signal; a second circuit which receives the first output signal and outputs a second output signal, wherein the second output signal is produced by delaying the first output signal; a first control circuit which receives the first and second output signal and controls the first circuit based on the first and second output signals; and a second control circuit which receives the first and second output signals and controls the second circuit based on the first and second output signals.

According to another aspect of the present invention, an integrated circuit is provided which comprises: a first circuit which receives an input signal, and outputs a first output signal which is increased in proportion to the high level width of the input signal to the low level width of the input signal when the high level width is less than the low level width, or in proportion to the low level width of the input signal to the high level width of the input signal when the low level width is less than the high level width; and a second circuit which inputs the first output signal and outputs a second output signal, wherein the first output signal is produced by delaying the output signal.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
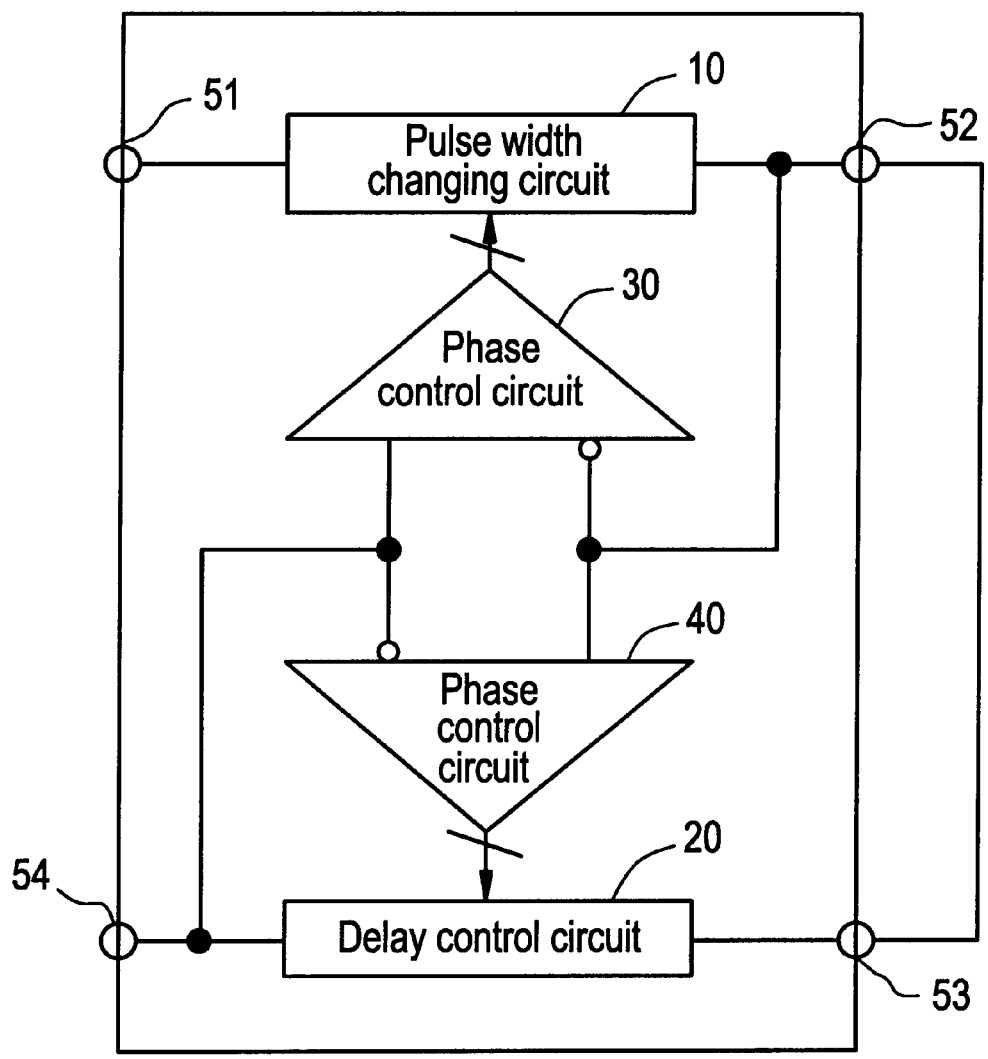
FIG. 1 is a block diagram of a first embodiment of the present invention.

Referring to FIG. 1, a integrated circuit comprises: a pulse width changing circuit 10 which receives an input signal and changes the pulse width of the input signal; a delay control circuit 20 which delays the input signal for an optional delay time; and phase control circuits 30 and 40 which control pulse width changing circuit 10 and delay control circuit 20, respectively.

Pulse width changing circuit 10 has an input terminal, an output terminal, and a control input terminal. The output terminal of pulse width changing circuit 10 is connected to the input terminal of delay control circuit 20, to an inverse input terminal of phase control circuit 30 which detects the trailing edge of the output signal from pulse width changing circuit 10, and to an input terminal of phase control circuit 40 which detects the leading edge of the output signal from pulse width changing circuit 10.

Delay control circuit 20 has an input terminal, an output terminal, and a control input terminal. The output of delay control circuit 20 is connected to an input terminal of phase control circuit 30 which detects the leading edge of the output signal from delay control circuit 20, and to an inverse input terminal of phase control circuit 40 which detects the trailing edge of the output signal from delay control circuit 20.

The control output of phase control circuit 30 is connected to the control input of pulse width changing circuit 10. The control output of phase control circuit 40 is connected to the control input of delay control circuit 20. FIG. 1 shows a typical configuration of this embodiment. Other similar configurations, which are not shown, are also intended to be covered by this embodiment.

Phase control circuit 30 has a terminal which receives the falling edge of an output signal from pulse width changing circuit 10 and a terminal which receives the rising edge of an output signal from delay control circuit 20. Phase control circuit 30 reduces the phase difference between the falling edge of the output signal from pulse width changing circuit 10 and the rising edge of the output signal from delay control circuit 23.

Phase control circuit 40 has a terminal which receives the rising edge of an output signal from pulse width changing circuit 10 and a terminal which receives the falling edge of an output signal from delay control circuit 20. Phase control circuit 40 reduces the phase difference between the rising edge of the output signal from pulse width changing circuit 10 and the falling edge of the output signal from delay control circuit 20.

Figure 2:
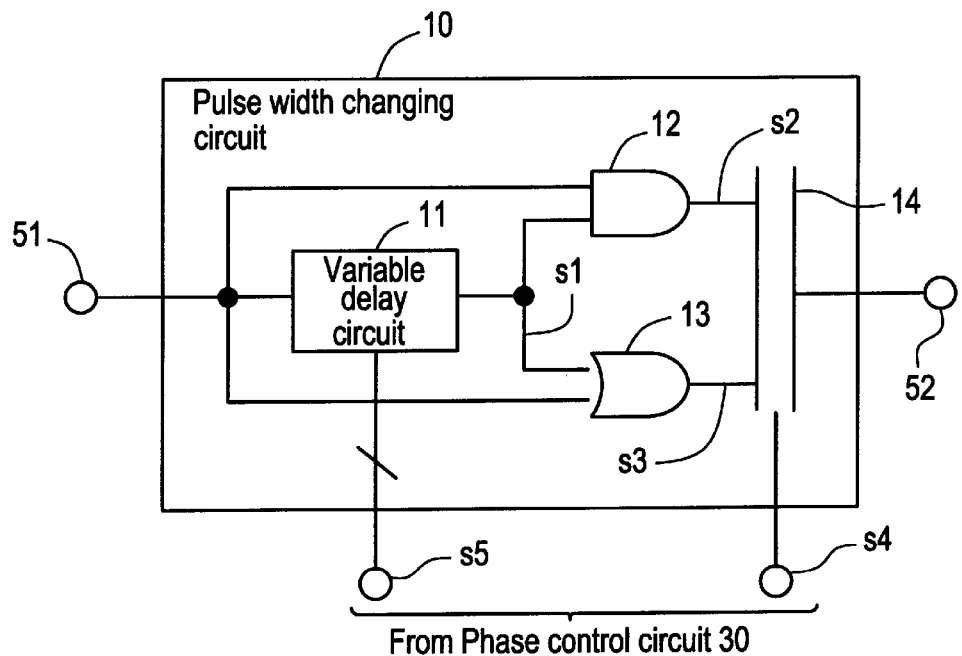
FIG. 2 is a block diagram of pulse width changing circuit 10 of the present invention.

Referring to FIG. 2, pulse width changing circuit 10 comprises: a variable delay circuit 11 which arbitrary delays the input signal received at an input terminal 51 and outputs the output signal; an AND circuit 12 which performs an AND operation on the input signal received at input terminal 51 and the output signal from variable delay circuit 11; an OR circuit 13 which performs an OR operation on the input signal received at input terminal 51 and the output signal from variable delay circuit 11; and a selector 14 which receives the output signals of AND circuit 12 and OR circuit 13, and selectively outputs either one of the output signals to an output terminal 52. The delay time of variable delay circuit 11 can be set by a part of the control output from phase control circuit 30 via a terminal s5, which is a part of the control input. AND circuit 12 outputs an output signal s2 whose high level pulse width is narrowed by the delay time of variable delay circuit 11 by performing an AND operation on the input signal received at input terminal 51 and a signal s1 delayed by variable delay circuit 11. OR circuit 13 outputs an output signal s3 whose high level pulse width is widened by the delay time of variable delay circuit 11 by performing an OR operation on the input signal received at input terminal 51 and signal s1 delayed by variable delay circuit 11. Selector 14 is controlled by a part of the control output from phase control circuit 30 via a terminal s4, and outputs either output signal s2 from AND circuit 12 or output signal s3 from OR circuit 13 to output terminal 52.

Figure 3:
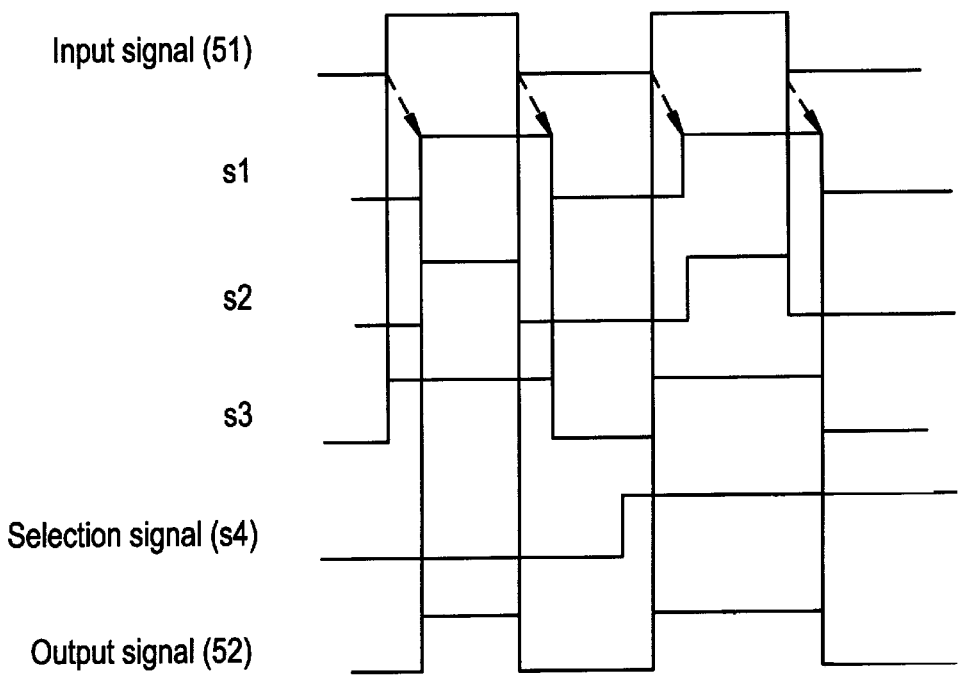
FIG. 3 is a waveform diagram showing the operation of pulse width changing circuit 10.

Referring to FIG. 3, in pulse width changing circuit 10, by adjusting the delay time of variable delay circuit 11 and switching selector 14 by the control output from phase control circuit 30, the pulse width of the output signal, which is output from the output terminal 52, can be optionally changed.

Figure 4:
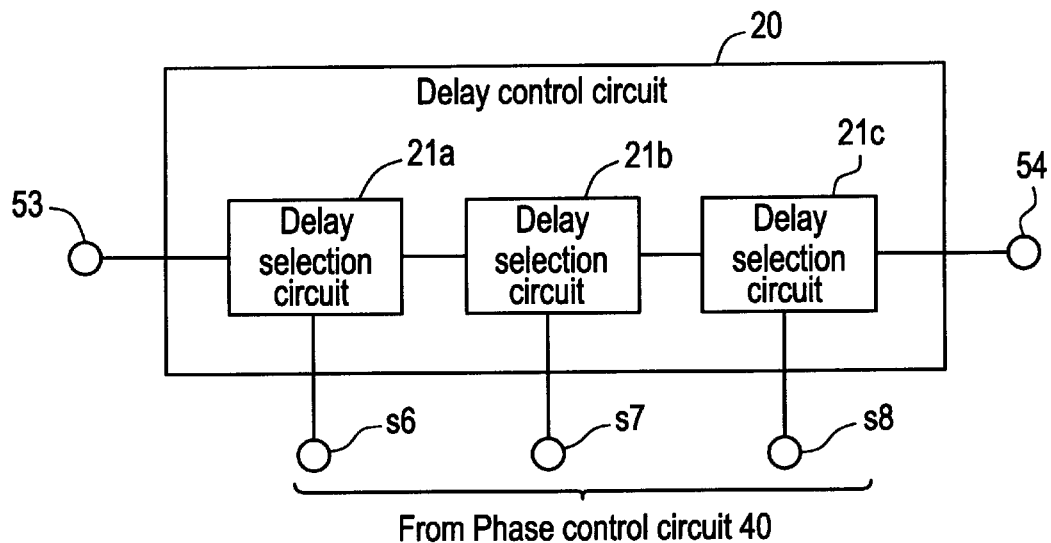
FIG. 4 is a block diagram of delay control circuit 20 in the present invention.

Referring to FIG. 4, delay control circuit 20 comprises a plurality of delay selection circuits 21 connected in series. Delay control circuit 20 delays an input signal based on the control output from phase control circuit 40. Each of the delay selection circuits 21 selectively delay the input signal or output the input signal as is. In this embodiment, three delay selection circuits 21a, 21b and 21c are connected in series. More specifically, the delay time, by which delay control circuit 20 delays the input signal, can be set delicately by making the delay time of delay selection circuit 21b twice as long as delay selection circuit 21a, by making the delay time of delay selection circuit 21c twice as long as delay selection circuit 21b, and by individually controlling each of delay selection circuits 21a to 21c by the control output from phase control circuit 40 via terminals s6, s7 and s8, respectively. The number of delay selection circuits 21 and their delay times are not limited to those shown in this embodiment, and can be determined optionally as required.

Figure 5:
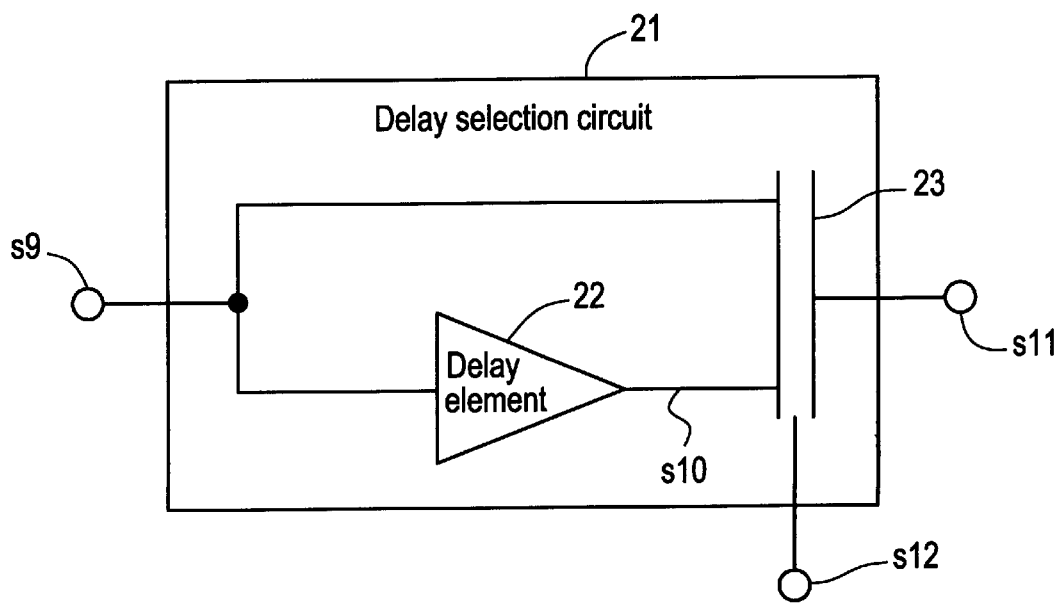
FIG. 5 is a block diagram of delay selection circuit 21 in the present invention.

In FIG. 5, delay selection circuit 21 includes a delay element 22 and a selector 23. A signal received at an input terminal s9 is branched into two signals, one of which is inputted into selector 23 as is, and the other is inputted into delay element 22. An output signal s10 is delayed by delay element 22 and inputted into selector 23. By switching the selection signal at terminal s12, either one of the input signals from terminal s9 or the output signal from delay element 22 is selected and outputted to an output terminal s11 based on the selection signal at terminal s12.

Figure 6:
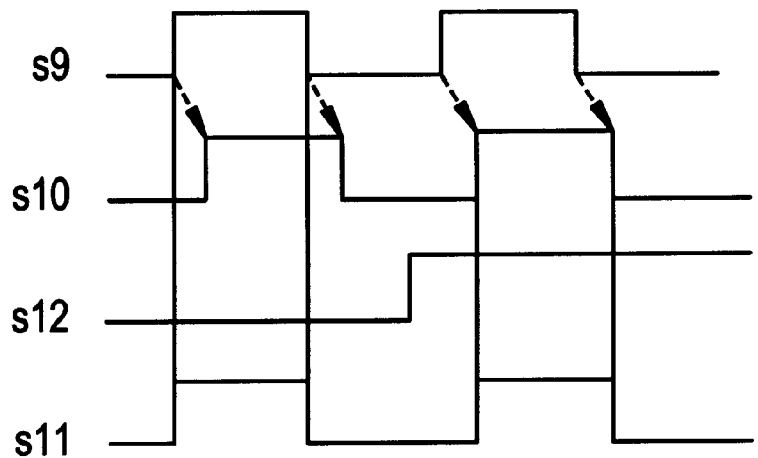
FIG. 6 is a waveform diagram showing the operation of delay selection circuit 21.

Referring to FIG. 6, in the operation of the delay selection circuit 21, the input signal received at input terminal s9 is outputted as the output signal to output terminal s11 if the selection signal from terminal s12 is at a low level. The output signal s10 from delay element 22 is outputted as the output signal to output terminal s11 if the selection signal s12 is at a high level. Also, the delay amount can be set based on the storage capacity of delay element 22.

Figure 7:
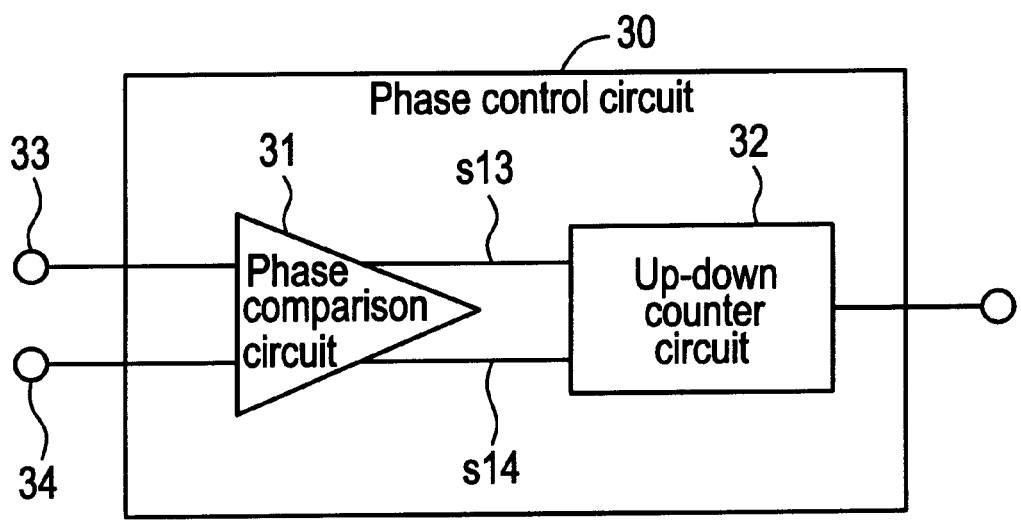
FIG. 7 is a block diagram of phase control circuit 30 in the present invention.

In FIG. 7, each of the phase control circuits 30 and 40 include a phase comparison circuit 31 and an up-down counter circuit 32. Phase comparison circuit 31 receives the signals from terminal 33 for detecting the leading edge of the pulse signal and terminal 34 for detecting the trailing edge of the pulse signal and compares the phases of the leading edge from terminal 33 and trailing edge from terminal 34. Phase comparison circuit 31 outputs the phase leading signal s13 and the phase delay signal s14 to up-down counter circuit 32. Up-down counter circuit 32 counts up or down based on the phase leading signal s13 or the phase delay signal s14 outputted from the phase comparison circuit 31, and outputs the control signal to pulse width changing circuit 10 or delay control circuit 20. Thus, in phase control circuit 30, pulse width changing circuit 10 is controlled to minimize the phase difference of the input signal. In phase control circuit 40, delay control circuit 20 is controlled to minimize the phase difference of the input signal.

Next, the operation of this embodiment will be described.

Referring to FIG. 1, a pulse signal received at input terminal 51 is sent to pulse width changing circuit 10 and its pulse width is changed by pulse width changing circuit 10. Delay control circuit 20 receives the signal outputted from pulse width changing circuit 10 and outputs it to output terminal 54 after controlling the delay time. The outputs of pulse width changing circuit 10 and delay control circuit 20 are fed back to pulse width changing circuit 10 and delay control circuit 20 through phase control circuits 30 and 40.

Phase control circuit 30 controls pulse width changing circuit 10 based on the times when the levels of the output signal from pulse width changing circuit 10 and the output signal from delay control circuit 20 change. More specifically, phase control circuit 30 controls pulse width changing circuit 10 so that the level of the output signal from pulse width changing circuit 10 falls when the level of the output signal from delay control circuit 20 rises.

Phase control circuit 40 controls delay control circuit 20 based on the times when the levels of the output signal from pulse width changing circuit 10 and the output signal from delay control circuit 20 change. More specifically, phase control circuit 40 controls delay control circuit 20 so that the level of the output signal from pulse width changing circuit 10 rises when the level of the output signal from delay control circuit 20 falls. Thus, in terminals 52, 53, and 54, pulse signals with the same pulse width at high and low levels, which are 50 percent duty signals, can be produced.

Figure 8:
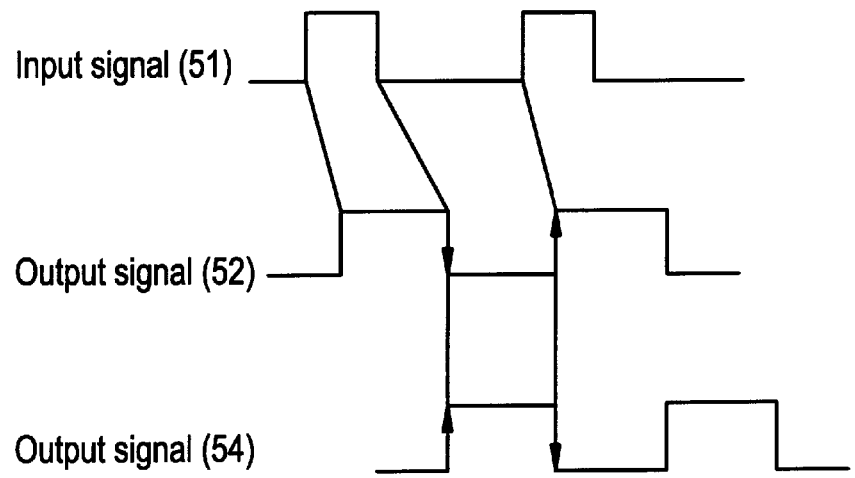
FIG. 8 is a waveform diagram showing the operation of the present invention when the high level pulse width of the input signal is less than the low level pulse width of the input signal.
Figure 9:
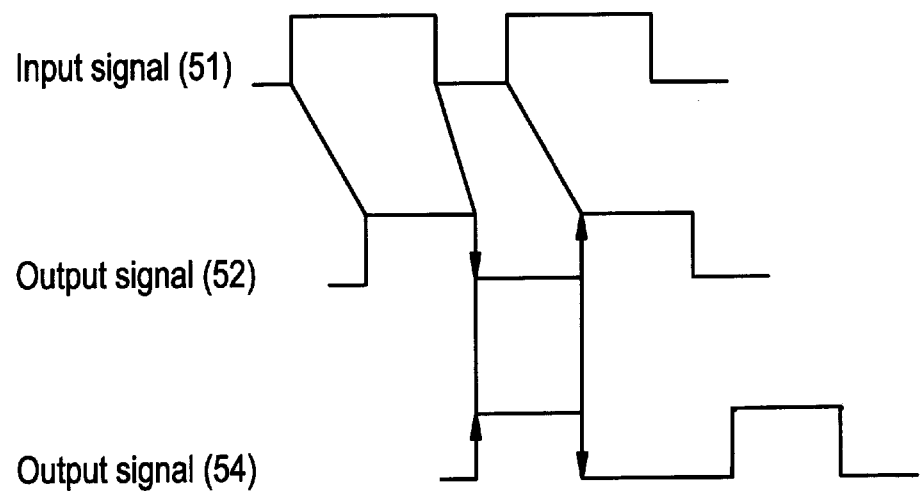
FIG. 9 is a waveform diagram showing the operation of the present invention when the low level pulse width of the input signal is less than the high level pulse width of the input signal.

In FIGS. 8 and 9, the high level pulse width of the signal obtained from terminal 52 is equalized with the low level pulse width because phase control circuit 30 controls pulse width changing circuit 10 to minimize the phase difference of the input signals. The signal obtained from terminal 54 is delayed by a half cycle from the signal obtained from terminal 52 to produce a high level pulse width that is equal to the low level pulse width, because phase control circuit 40 controls delay control circuit 20 to minimize the phase difference of the input signals.

When there is no phase difference between the trailing edge of the signal obtained from terminal 52 and the leading edge of the signal obtained from terminal 54, and there is no phase difference between the leading edge of the signal obtained from terminal 52 and the trailing edge of the signal obtained from terminal 54, the following relations are established between a cycle T of the input signal received at input terminal 51, a high level pulse width tw of the signal from terminal 52, and a delay time td from delay control circuit 20:

T=tw+td tw=td.

Since T=tw+td=2tw, tw=T/2.

Thus, a pulse signal of which pulse width tw is ½ of the cycle T can be produced, that is, the duty is 50 percent of the input signal.

Next, a second embodiment of the present invention will be described below.

Figure 10:
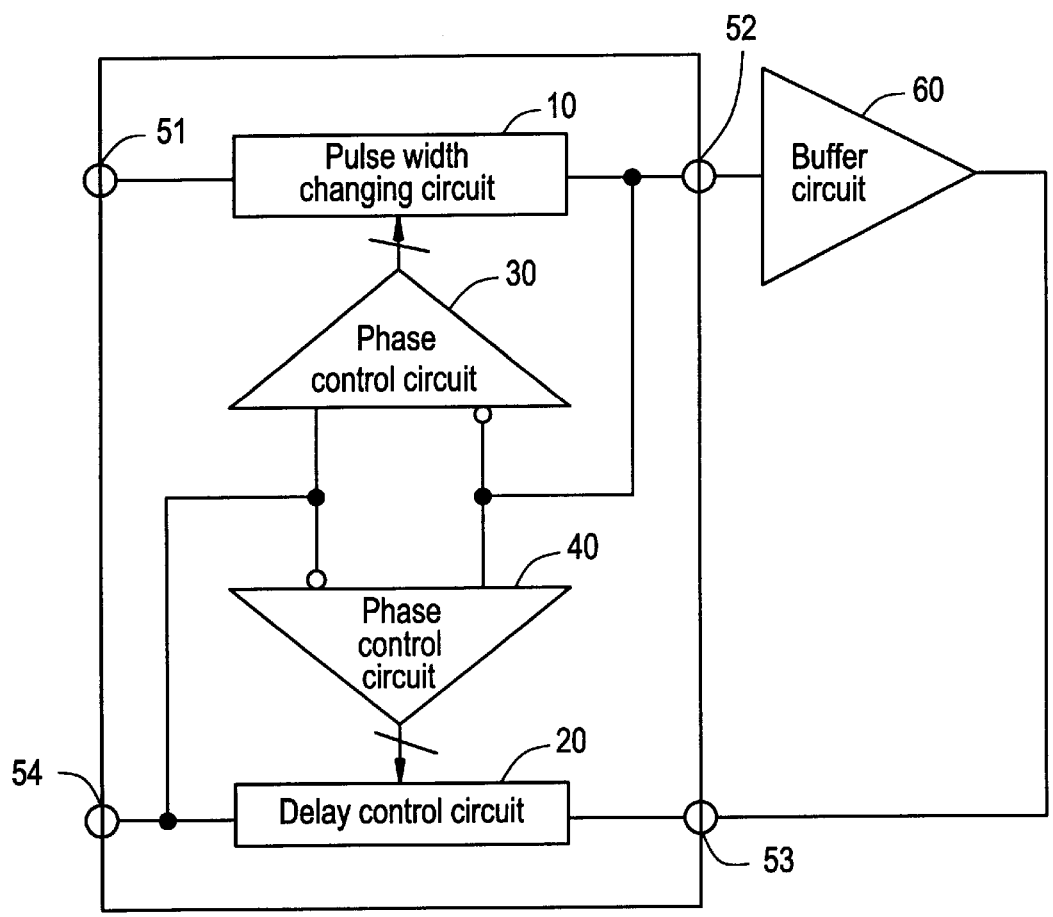
FIG. 10 is a block diagram of a second embodiment of the present invention.

Referring to FIG. 10, an integrated circuit according to this embodiment comprises: a pulse width changing circuit 10 which changes the pulse width of an input signal; a delay control circuit 20 which delays the input signal at an optional delay time; phase control circuits 30 and 40 which control pulse width changing circuit 10 and delay control circuit 20, respectively; and a buffer circuit 60 which delays the output signal from pulse width changing circuit 10 for a predetermined time and sends the signal to delay control circuit 20. In this embodiment, all of the components and connections, except buffer circuit 60, are identical to the corresponding components of the first embodiment shown in FIG. 1.

By providing a buffer circuit 60 between the output of pulse width changing circuit 10 and the input of delay control circuit 20, the load on delay control circuit 20 is decreased, and the circuit size of delay control circuit 20 can be reduced. Therefore, the output signals with 50 percent duty can be distributed to many loads.

Next, a third embodiment of the present invention will be described below.

Figure 11:
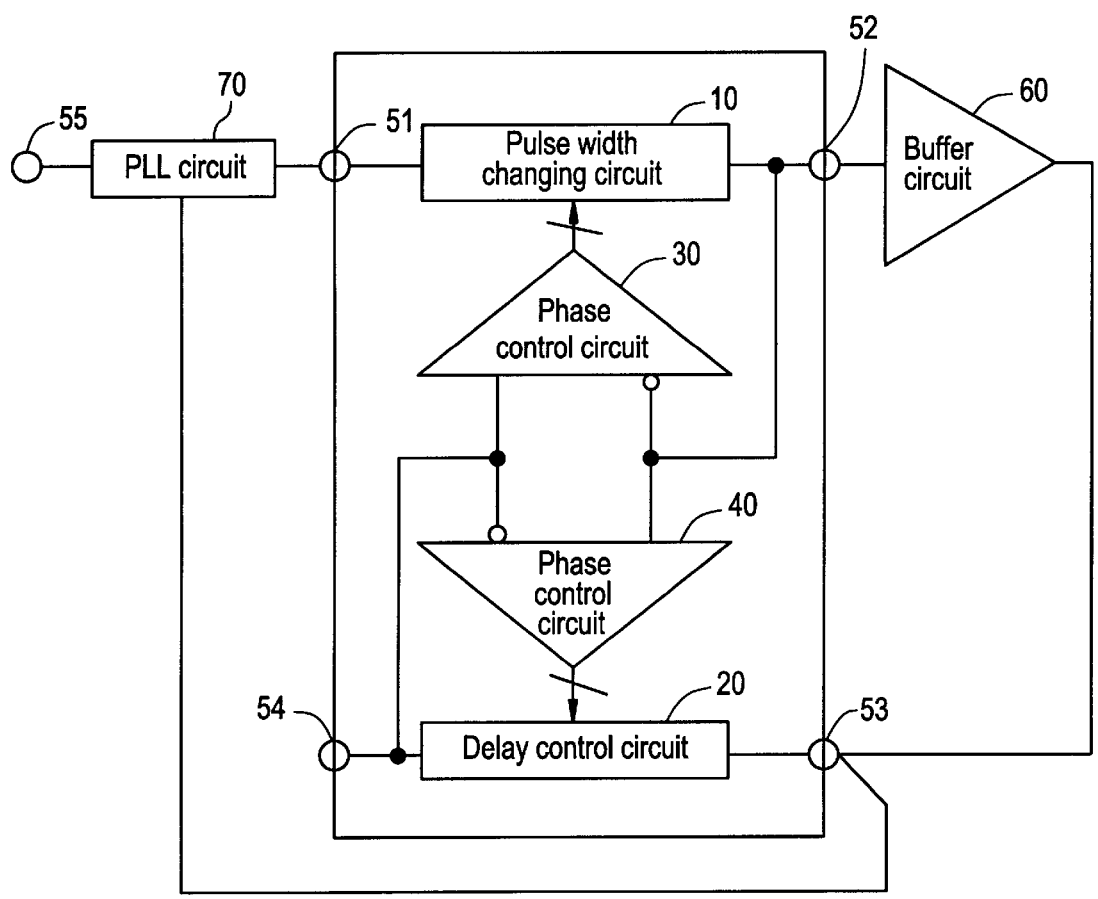
FIG. 11 is a block diagram of a third embodiment of the present invention.
Figure 12:
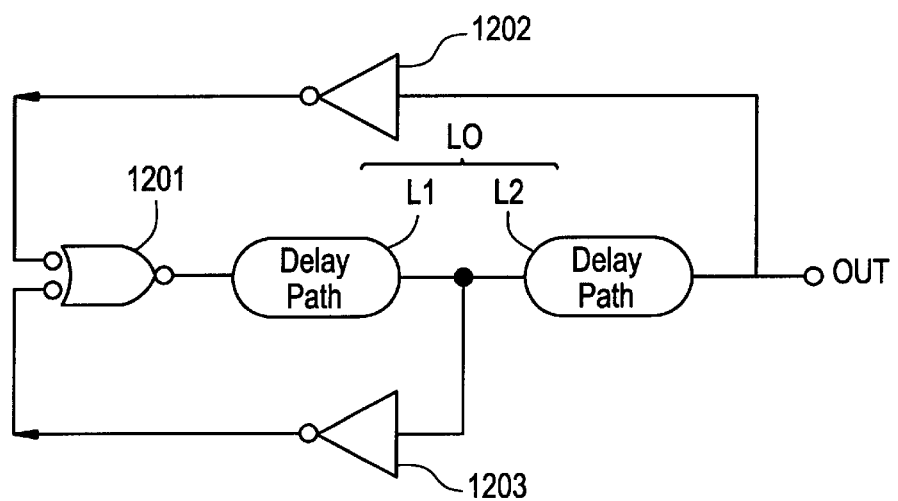
FIG. 12 is a block diagram of a first conventional integrated circuit.
Figure 13:
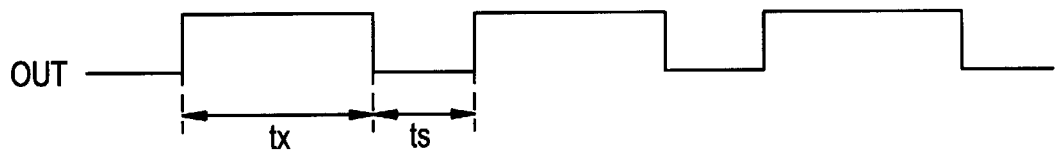
FIG. 13 is a waveform diagram showing the operation of the first conventional integrated circuit.
Figure 14:
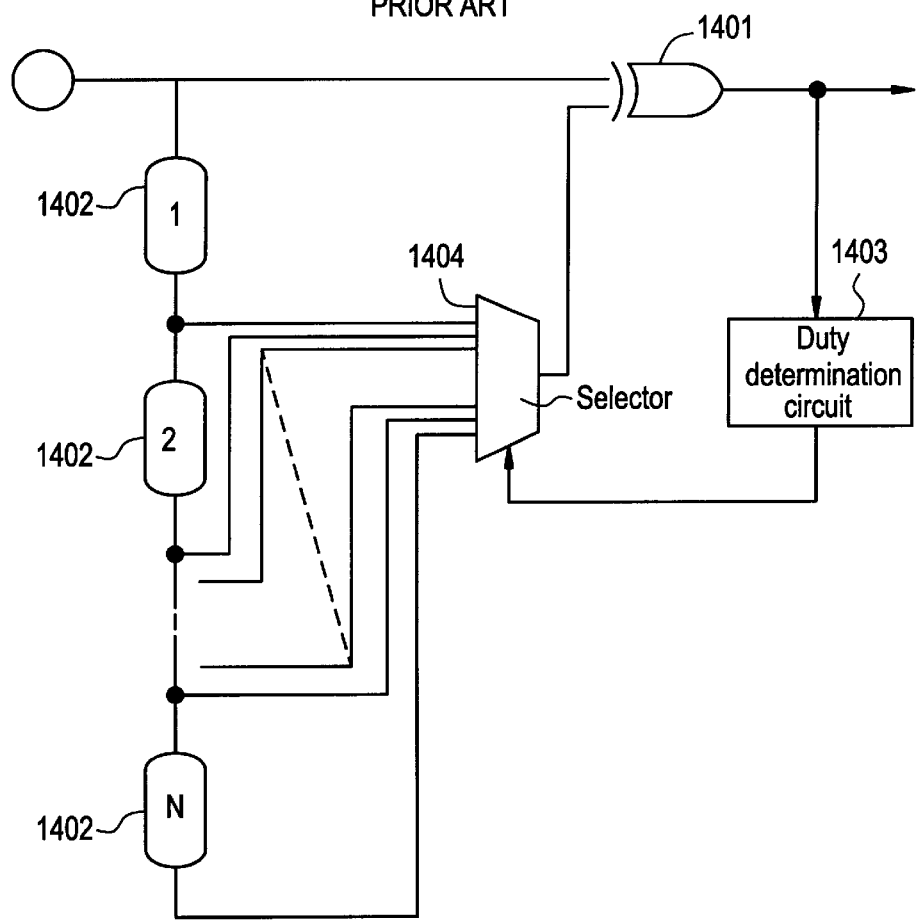
FIG. 14 is a block diagram of a second conventional integrated circuit.
Figure 15:
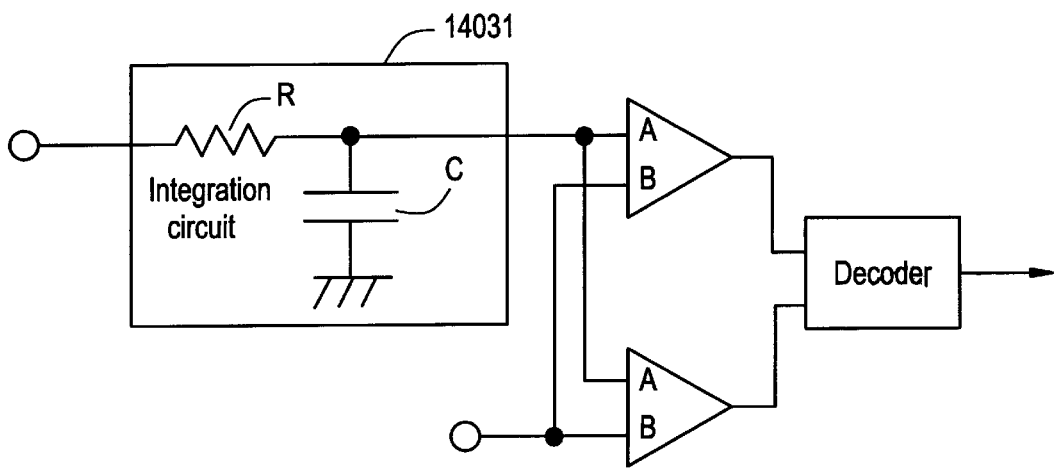
FIG. 15 is a block diagram of duty determination circuit 1403 used in the second conventional integrated circuit.

Referring to FIG. 11, an integrated circuit according to this embodiment comprises: a pulse width changing circuit 10 which changes the pulse width of an input signal; a delay control circuit 20 which delays the input signal at an optional delay time; phase control circuits 30 and 40 which control pulse width changing circuit 10 and delay control circuit 20, respectively; a buffer circuit 60 which delays the output signal from pulse width changing circuit 10 for a certain time and sends the signal to delay control circuit 20; and a phase locked loop (PLL) circuit 70 connected to the input terminal 51 of pulse width changing circuit 10. In this embodiment, pulse width changing circuit 10, delay control circuit 20, and phase control circuits 30 and 40 are identical to the corresponding components of the first embodiment shown in FIG. 1. Buffer circuit 60 is identical to buffer circuit 60 of the second embodiment shown in FIG. 10.

Since PLL circuit 70 is connected to the input terminal 51 of pulse width changing circuit 10, the input signal is inputted into pulse width changing circuit 10 after passing through PLL circuit 70. An input terminal 53 of delay control circuit 20 is connected to the feedback input of PLL circuit 70. By matching the phase of the feedback signal received from terminal 53, that is, the output signal of buffer circuit 60, with the phase of the input signal inputted into an input terminal 55 of PLL circuit 70, the skew due to the delay of pulse width changing circuit 10 and buffer circuit 60 can be minimized.

As described above, the high level pulse width of an output signal can be equalized with the low level pulse width even if the high level pulse width of an input signal differs from the low level pulse width. Phase control circuits detect the high level pulse width of the input signal and the low level pulse width, and feed back the results to adjust the pulse width of the input signal. Therefore, pulse signals with a duty of 50 percent can be produced.

While this invention has been described in conjunction with the preferred embodiments described above, it will now be possible for those skilled in the art to put this invention into practice using various other manners.

What is claimed is:

1. An integrated circuit comprising:
   a first circuit which receives an input signal includes a circuit which changes the pulse width of said input signal and outputs the output of said circuit as a first output signal;
   a second circuit which receives said first output signal includes a delay circuit which delays said first output signal and outputs the output of said delay circuit as a second output signal;
   a first control circuit which receives said first and second output signals and controls said first circuit based on said first and second output signals; and
   a second control circuit which receives said first and second output signals and controls said second circuit based on said first and second output signals.

2. The integrated circuit as claimed in claim 1, wherein said first control circuit controls said first circuit based on times when levels of said first and second output signals change.

3. The integrated circuit as claimed in claim 1, wherein said second control circuit controls said second circuit based on times when levels of said first and second output signals change.

4. The integrated circuit as claimed in claim 1, wherein said first control circuit controls said first circuit so that the level of said first output signal falls when the level of said second output signal rises.

5. The integrated circuit as claimed in claim 1, wherein said second control circuit controls said second circuit so that the level of said first output signal rises when the level of said second output signal falls.

6. The integrated circuit as claimed in claim 1, wherein said first control circuit has a first terminal which receives a falling edge of said first output signal and a second terminal which receives a rising edge of said second output signal, and reduces a phase difference between said falling edge of said first output signal and said rising edge of said second output signal.

7. The integrated circuit as claimed in claim 1, wherein said second control circuit has a first terminal which receives a rising edge of said first output signal and a second terminal which receives a falling edge of said second output signal, and reduces a phase difference between said rising edge of said first output signal and said falling edge of said second output signal.

8. The integrated circuit as claimed in claim 1, further comprising:
   a buffer circuit which receives said first output signal and outputs a third output signal to said second circuit, wherein said third output signal is produced by delaying said first output signal by said buffer circuit.

9. The integrated circuit as claimed in claim 8, further comprising:
   a phase locked loop circuit which receives said input signal and said third output signal, and outputs a fourth output signal to said first circuit so that a phase of said input signal adjusts a phase of said third output signal.

10. An integrated circuit comprising:
    a first circuit which receives an input signal, includes a circuit which increases the width of a high level pulse of said input signal in proportion to a width of a low level pulse of said input signal when said width of said high level pulse is less than the width of the low level pulse or increases the width of the low level pulse of said input signal in proportion to the width of the high level pulse of said input signal when said width of said low level pulse is less than the width of said high level pulse, and outputs the output of said circuit as a first output signal;
    a second circuit which receives said first output signal, includes a delay circuit which delays said first output signal, and outputs the output of said delay circuit as a second output signal;
    a first control circuit which receives said first output signal and said second output signal, and controls said first circuit based on the phases of said first output signal and second output signal; and
    a second control circuit which receives said first output signal and said second output signal, and controls said second circuit based on the phases of said first output signal and second output signal.

11. The integrated circuit as claimed in claim 10, wherein said first control circuit has a first terminal which receives a falling edge of said first output signal and a second terminal which receives a rising edge of said second output signal, and reduces a phase difference between said falling edge of said first output signal and said rising edge of said second output signal.

12. The integrated circuit as claimed in claim 10, wherein said second control circuit has a first terminal which receives a rising edge of said first output signal and a second terminal which receives a falling edge of said second output signal, and reduces a phase difference between said rising edge of said first output signal and said falling edge of said second output signal.

13. The integrated circuit as claimed in claim 10, further comprising:
    a buffer circuit which receives said first output signal and outputs a third output signal to said second circuit, wherein said third output signal is produced by delaying said first output signal by said buffer circuit.

14. The integrated circuit as claimed in claim 13, further comprising:
    a phase locked loop circuit which receives said input signal and said third output signal, and outputs a fourth output signal to said first circuit so that a phase of said input signal adjusts a phase of said third output signal.

* * * * *

UNITED STATES PATENT AND TRADEMARK OFFICE
CERTIFICATE OF CORRECTION

PATENT NO. : 6,157,234
DATED : December 5, 2000
INVENTOR(S) : Hiroshi Yamaguchi

It is certified that error appears in the above-identified patent and that said Letters Patent is hereby corrected as shown below:

Column 4,
Line 10, delete "23" insert -- 20 --;
Line 63, delete "21 a" insert -- 21a --.

Signed and Sealed this

Eleventh Day of December, 2001

*Attest:*

NICHOLAS P. GODICI
*Attesting Officer*    *Acting Director of the United States Patent and Trademark Office*